United States Patent
Delaunay et al.

(10) Patent No.: US 7,160,585 B2
(45) Date of Patent: Jan. 9, 2007

(54) PROCESS FOR MAKING AT LEAST ONE NANOTUBE BETWEEN TWO ELECTRICALLY CONDUCTING ELEMENTS AND DEVICE FOR IMPLEMENTING SUCH A PROCESS

(75) Inventors: Marc Delaunay, Meylan (FR); Anne Senillou, Saint-Egreve (FR); Marie-Noelle Semeria, Rochetiere (FR)

(73) Assignee: Commissariat a l'Energie Atomique, Paris (FR)

( * ) Notice: Subject to any disclaimer, the term of this patent is extended or adjusted under 35 U.S.C. 154(b) by 534 days.

(21) Appl. No.: 10/330,618

(22) Filed: Dec. 26, 2002

(65) Prior Publication Data
US 2003/0173206 A1   Sep. 18, 2003

(30) Foreign Application Priority Data
Dec. 26, 2001   (FR) ................................. 01 16871

(51) Int. Cl.
C23C 16/26   (2006.01)
C23C 16/511   (2006.01)
D01F 9/12   (2006.01)
D01F 9/127   (2006.01)

(52) U.S. Cl. ...................... 427/571; 427/573; 427/575; 427/577; 427/249.1; 427/903; 423/447.1; 423/447.3; 423/445 B; 977/843

(58) Field of Classification Search ................ 427/571, 427/573, 575, 577, 122, 249.1, 249.6, 903; 423/447.1, 447.3, 445 B; 977/DIG. 1, 843; 118/723 MR, 723 MA
See application file for complete search history.

(56) References Cited

U.S. PATENT DOCUMENTS 5,863,601 A * 1/1999 Kikuchi et al. ............. 427/200

(Continued)

FOREIGN PATENT DOCUMENTS

EP   0 967 844   12/1999

(Continued)

OTHER PUBLICATIONS

S.H. Tsai et al., "*Synthesis and characterization of the aligned hydrogenated amorphous carbon nanotubes by electron cyclotron resonance excitation*", Nov. 25, 1999, pp. 11-15.

(Continued)

*Primary Examiner*—Timothy Meeks
*Assistant Examiner*—Wesley D. Markham
(74) *Attorney, Agent, or Firm*—Thelen Reid & Priest LLP

(57) ABSTRACT

A process makes at least one nanotube between two electrically conducting elements located on a substrate, using, inside a deposition chamber, a microwave power, a magnetic field, and at least one electronic cyclotron resonance zone faciliting ionization and/or dissociation of a gas containing carbon injected into the deposition chamber at a low pressure inside the deposition chamber, causing ionization and/or dissociation of this gas in each electronic cyclotron resonance zone. The ions and electrons produced are located along the field lines of the magnetic field set up in the deposition chamber. The process also includes a screening operation of the various species produced in each electronic cyclotron resonance zone to enable exclusive access of $C_xH_y^\circ$ non condensable free radicals produced to access a deposition zone adjacent to at least one part of the substrate including the two electrically conducting elements to make the nanotube.

10 Claims, 2 Drawing Sheets

U.S. PATENT DOCUMENTS

| | | |
|---|---|---|
| 6,337,110 B1 | 1/2002 | Delaunay et al. ............ 427/571 |
| 6,346,189 B1 * | 2/2002 | Dai et al. .................... 205/766 |
| 6,346,303 B1 * | 2/2002 | Shih et al. ................... 427/571 |
| 6,420,092 B1 * | 7/2002 | Yang et al. .................. 430/311 |
| 6,522,055 B1 * | 2/2003 | Uemura et al. .............. 313/310 |
| 6,787,200 B1 * | 9/2004 | Delaunay et al. ............ 427/571 |
| 2003/0059968 A1 * | 3/2003 | Cheng et al. ................. 438/20 |

FOREIGN PATENT DOCUMENTS

| | | | |
|---|---|---|---|
| JP | 2001-192829 A | * | 7/2001 |
| JP | 2001-295047 A | * | 10/2001 |
| JP | 2002-069643 A | * | 3/2002 |
| WO | WO 01/03158 | | 1/2001 |
| WO | WO 01/44796 | | 6/2001 |

OTHER PUBLICATIONS

Y.Y. Wei et al., "*Directed assembly of carbon nanotube electronic circuits*", Jun. 19, 2000, pp. 3759-3761.

Hyongsok T. Soh et al., "*Integrated nanotube circuits: Controlled growth and ohmic contacting of single-walled carbon nanotubes*", Jun. 4, 1999, pp. 627-629.

Young Chul Choi et al., "*Effect of surface morphology of Ni thin film on the growth of aligned carbon nanotubes by microwave plasma-enhanced chemical vapor deposition*", Oct. 15, 2000, pp. 4898-4903.

Chris Bower et al., "*Plasma-induced alignment of carbon nanotubes*", Aug. 7, 2000, pp. 830-832.

Henk W.C. Postma, "*Manipulation and Imaging of Individual Single-Walled Carbon Nanotubes with an Atomic Force Microscope*", Sep. 1, 2000, pp. 1299-1301.

* cited by examiner

PROCESS FOR MAKING AT LEAST ONE NANOTUBE BETWEEN TWO ELECTRICALLY CONDUCTING ELEMENTS AND DEVICE FOR IMPLEMENTING SUCH A PROCESS

This application claims priority to French Application No. 0116871 which was filed Dec. 26, 2001 and which was not published in English.

TECHNICAL FIELD

The technical field of this invention is processes and devices for making nanotubes and/or nanowires (solid nanotubes) comprising carbon atoms, between two electrically conducting elements, the two electrically conducting elements being prelocated on a substrate. "Nanotube" means tubes comprising carbon atoms with a diameter of a few nanometers and a few tens of nanometers, and preferably between 1 and 100 nm.

These assemblies are composed of two electrically conducting elements connected to each other through a nanotube, and are used particularly for making nano components in the field of molecular electronics. For example, these assemblies may have an application in field effect transistors, RAM type memories or any type of electronic junction.

It is quite possible to use this type of assembly to make very high density logical architectures or memories, these assemblies having the advantage that they have a relatively simple design.

The assemblies mentioned above may also be applicable to the biotechnology field, for making chemical nano-sensors or biosensors by grafting molecules.

STATE OF PRIOR ART

In prior art, there are three main types of processes for making nanotubes and nanowires.

These main types are physical vapor deposition (PVD) methods, chemical vapor deposition (CVD) methods, and finally hybrid CVD methods that consist of using a CVD method combined with a plasma created by microwaves or filament.

However, these conventional methods, described particularly in the documents by C. Bower et al., Applied Physics Letters, Volume 77 p. 830 (2000)" and "Y. C. Choi et al., Journal of Applied Physics, Volume 88 p. 4898 (2000)" are used particularly for making nanotubes extending perpendicular to a surface on which precipitation is initiated, and not to make a junction of two electrically conducting elements located on a substrate, since this type of process is much more complex to implement.

However, note that several different implementations have already been proposed in this field of assemblies composed of two electrically conducting elements connected to each other through one or several nanotubes.

A first approach described in document "H. Postma et al., Advanced Material No. 17 p. 1299 (2000)" consists of making several nanotubes before distributing them on a substrate. It is then necessary to manipulate them to position them correctly with respect to electrodes to be connected, and then to make the metallic connection with these electrodes.

This method is still very tedious, to the extent that the operation for manufacturing these nanotubes and the operation for connecting these nanotubes with the electrodes, are two steps that must necessarily be made in sequence. Therefore, the proposed method is completely incompatible with mass production. Furthermore, the electrical resistance at the nanotube—electrode contact is very high and is not controlled, and can be as high as 10 Mohm.

Another method described in document "H. T. Soh et al., Applied Physics Letters, vol. 75, No. 5 p. 627 (1999)" consists of firstly implementing two catalytic microzones at the ends of two electrodes. Nanotubes are then manufactured at high temperature using a conventional CVD method in which methane is used as the gas to be ionized/dissociated.

However, this manufacturing method makes it necessary to cut all nanotubes made in excess of requirements. Thus, this method is not suitable for mass production either, particularly due to the addition of a final step for cleaning the assembly formed by the nanotube and the electrodes.

Finally, one last method described in document "Y. Y. Wei and G. Eres, Applied Physics Letters, vol. 76, No. 25, p. 3759 (2000)" consists of covering two microelectrodes with a catalyst and then using a conventional CVD method using acetylene to obtain the junction by nanotubes between these two microelectrodes.

As in the previous method, although the connection of the nanotubes to the electrodes is made while the nanotubes are being made, the proposed method is still unable to control the number of nanotubes made between these two electrodes. Furthermore, the quality of the junction is not fully controlled either, which makes it necessary to keep only nanotubes for which the connection to electrodes was made easily and successfully.

PRESENTATION OF THE INVENTION

Therefore, the purpose of this invention is to present a process for making nanotubes between two electrically conducting elements, at least partially overcoming the disadvantages mentioned above for methods used in prior art.

Furthermore, another purpose of the invention is to present a device that will be capable of implementing a manufacturing process like that satisfying the purpose mentioned above.

To achieve this, the first object of the invention is a process for making at least one nanotube between two electrically conducting elements located on a substrate, the process using, inside a deposition chamber, a microwave power, a magnetic field and at least one electronic cyclotron resonance zone facilitating ionization and/or dissociation of a gas containing carbon injected into the deposition chamber.

According to the invention, the injection of gas containing carbon is made at low pressure inside the deposition chamber, causing ionization and/or dissociation of this gas in each electronic cyclotron resonance zone, the ions and electrons produced being located along the field lines of the magnetic field set up in the deposition chamber. Furthermore, the process also comprises a screening operation of the various species produced in each electronic cyclotron resonance zone to enable exclusive access of $C_xH_y^{20}$ type non condensable free radicals produced to access a deposition zone adjacent to at least one part of the substrate comprising the two electrically conducting elements, to make the said nanotube.

Advantageously, the process according to the invention results in creation of a low pressure magnetized plasma at electronic cyclotron resonance. The ions and electrons produced in the plasma are located on the field lines of the magnetic field, and therefore circulate inside the deposition chamber along an imposed direction corresponding to the direction of the field lines of the magnetic field. Consequently, by screening the various species present in the plasma, it is easy to prevent ions and electrons from accessing the deposition zone in which the electrically conducting elements to be connected are located. Furthermore, the other species contained in the plasma, namely non-magnetized free radicals, circulate freely inside the deposition chamber. Thus, the non-condensable $CxHy°$ type free radicals easily penetrate into the deposition zone to form the connecting nanotube between the two electrically conducting elements.

With the use of this type of process, elements harmful to growth of nanotubes such as ions, electrons and all directly condensable species, are kept away from the deposition zone into which only $CxHy°$ type non condensable free radicals are able to penetrate, to make a high quality nanotube.

The presence of a plasma at electronic cyclotron resonance is a means of advantageously producing a more dissociated and more reactive set of free organic radicals than can be produced in conventional CVD methods used in embodiments in prior art, thus facilitating smooth growth of the nanotubes from one conducting element to the other. Furthermore, with this process, precipitation of nanotubes from one electrically conducting element to another advantageously takes place matching the part of the substrate between these two elements. Furthermore, the connection structure obtained between the two elements is advantageously different from the structure of nanotubes in "spider web" form, since this type of structure is absolutely not suitable for the connection to be made.

Advantageously, the electrical contact resistance between the nanotube obtained by the process according to the invention and electrically conducting elements remains low compared with the resistances obtained using processes according to prior art.

According to one preferred embodiment of the invention, the screening operation is made by inserting a metallic plate between the electronic cyclotron resonance zone and the electrically conducting elements. Furthermore, the metallic plate is approximately perpendicular to the field lines of the magnetic field applied in the deposition chamber, such that the ions and electrons produced do not penetrate into the deposition zone.

Preferably, a direction of growth of each nanotube is made preferential by the application of at least one element among the group composed of a temperature gradient, a magnetic field or an electric field, in the deposition zone. Advantageously, application of these specific means increases the probability of connection between two electrically conducting elements by introduction of a preferential direction for propagation of the nanotubes.

Preferably, the process comprises the following steps:
heat the substrate,
apply the microwave power inside the deposition chamber,
inject the gas containing carbon,
apply the magnetic field inside the deposition chamber, so as to create field lines approximately perpendicular to the substrate and cause ionization and/or dissociation of the gas in the electronic cyclotron resonance zone, such that the ions and the electrons produced are located on the field lines of the magnetic field,
screen the species produced to enable exclusively $CxHy°$ type non-condensable free radicals to access the deposition zone.

Preferably, the substrate heating operation takes place at a temperature of between about 500° C. and about 700° C., which is sufficient to supply the activation energy necessary for growth of the nanotubes.

Advantageously, for economic reasons, a microwave power generator is used at a frequency of the order of 2.45 GHz. Obviously, it would be possible to work at a higher or lower frequency.

The gas containing carbon is advantageously chosen from among alkanes, alkenes, alkynes, and mixes of these gasses.

Preferably, the low injection pressure of the gas containing carbon is less than about $3\times10^{-3}$ mbars, this low pressure increasing the energy of the electrons.

The magnetic field applied in the deposition chamber is preferably of the highly unbalanced magnetic mirror type, the magnetic field being maximum where the microwave power is injected and minimum at the center of the deposition chamber, and then increasing again when approaching the substrate. Note that this type of magnetic mirror is made for confinement.

Preferably, the electrically conducting elements comprise at least one zone containing at least one element chosen among iron, nickel, cobalt or any other metal or alloy with catalytic fixation and dehydrogenation properties of $CxHy°$ type non condensable free radicals.

Another purpose of the invention is a device for making at least one nanotube between two electrically conducting elements located on a substrate, the device comprising:
a deposition chamber,
means for injecting a microwave power inside the deposition chamber,
means for creating a magnetic field inside the deposition chamber,
at least one electronic cyclotron resonance zone inside the deposition chamber.

According to the invention, the device also comprises:
injection means for introducing a gas containing carbon inside the deposition chamber, at low pressure,
a screen delimiting a deposition zone adjacent to at least part of the substrate comprising the two electrically conducting elements and accessible only to $CxHy°$ type non-condensable free radicals.

Other advantages and specificities of the invention will become clear from the detailed and non-limitative description given below.

BRIEF DESCRIPTION OF THE FIGURES

This description will be made with respect to the attached drawings, wherein.

DETAILED PRESENTATION OF A PREFERRED EMBODIMENT

Figure 1:
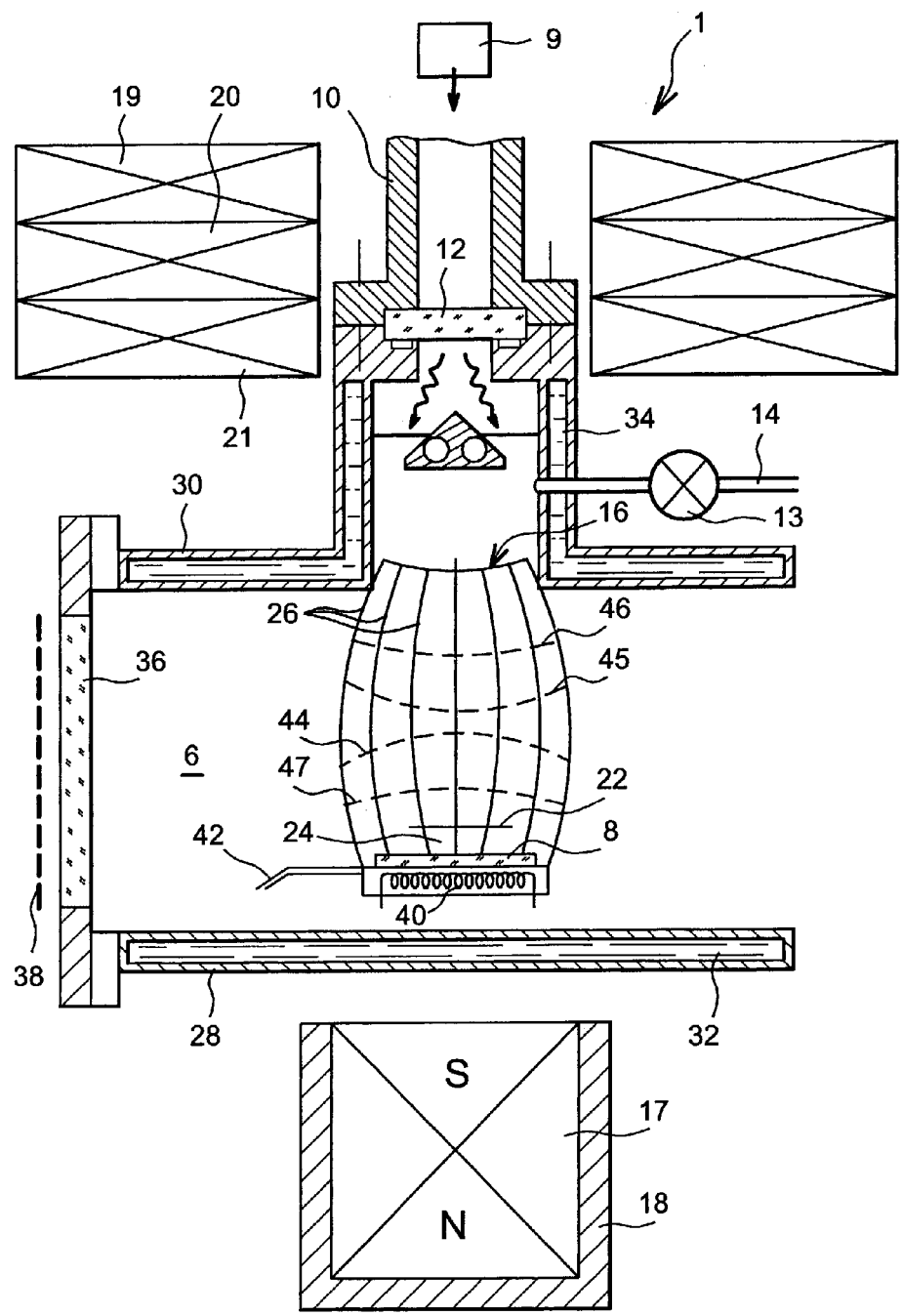
FIG. 1 shows a diagrammatic front sectional view of a device for making at least one nanotube between two electrically conducting elements according to a preferred embodiment of the invention.
Figure 2:
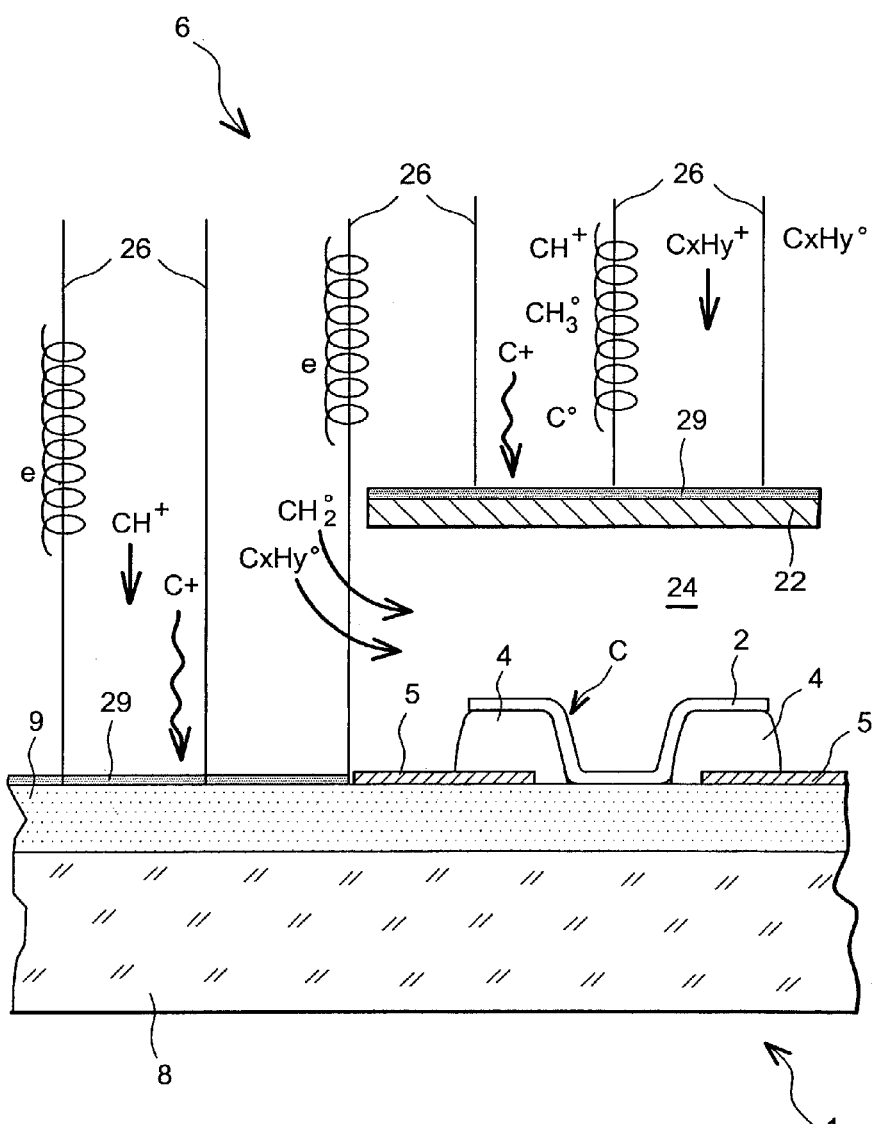
FIG. 2 shows a diagrammatic view at larger scale of part of the deposition chamber of the device in FIG. 1.

FIGS. 1 and 2 show a device 1 for making at least one nanotube between two electrically conducting elements 4, by a plasma at electronic cyclotron resonance. These electrically conducting elements 4 are preferably metallic pins comprising a zone containing at least one element such as iron, nickel, cobalt or any other metal or alloy with catalytic fixation and dehydrogenation properties for CxHy° type non condensable free radicals.

Note that each electrically conducting element 4 is positioned on an electrical connection electrode 5.

Still with reference to FIGS. 1 and 2, the device 1 comprises a deposition chamber 6 inside which there is a substrate 8, preferably made of silicon, comprising an insulating layer 9 preferably made of $SiO_2$. The electrodes 5 and several electrically conducting elements, including the two elements 4 that are to be connected, are supported on this insulating layer 9.

The deposition chamber 6 is partially delimited by double wall stainless steel structures 28, 30 coupled to cooling systems 32, 34. An observation port 36 and a protection grid 38 may also be provided to allow the manipulator visual access to the operations being carried out.

The device 1 comprises microwave power injection means 9 at the top part of this deposition chamber 6, the injection means 9 being arranged such that the microwaves are inserted into the device 1 so as to pass through a wave guide 10, and then. pass through a window leak tight to microwaves 12, and preferably made of quartz or alumina. The microwaves are then preferably directed towards the inside of the deposition chamber 6, to limit the cost of the device, at a frequency of about 2.45 GHz and with a power of about 500 W.

The device 1 also comprises injection means 13, 14 that can add a gas containing carbon inside the deposition chamber 6, these means 13, 14 particularly consisting of a gas transfer pipe 14 and a leakage valve 13.

The gas containing carbon is preferably chosen from among alkanes, alkenes and alkynes, and mixes of these gasses. More particularly, methane and acetylene are used.

Means of injecting the gas 13, 14 are designed to make low pressure injections. Note that a low pressure means a pressure of less than approximately $3 \times 10^{-3}$ mbars, and preferably equal to about $8 \times 10^{-4}$ mbars.

Furthermore, the device 1 comprises means 17, 18 for creating a magnetic field inside the deposition chamber 6, these means comprising a permanent magnet 17 located under the deposition chamber 6, and a permanent magnet casing 18.

The means for creating the magnetic field also comprise magnetic field coils 19, 20, 21 located above the deposition chamber 6 surrounding the wave guide 10.

The device 1 is also provided with at least one electronic cyclotron resonance zone 16, located inside the deposition chamber 6, and facing the substrate 8.

The electronic cyclotron resonance zone 16 is a magnetic field zone such that the magnetic field module satisfies the following relation:

$$W_{HF} = W_{CE} = (q_e \cdot B_r)/m_e \text{ where:}$$

$W_{HF}$=angular frequency of the injected high frequency wave;

$W_{CE}$=cyclotronic angular frequency of the electrons;

$q_e$=electron charge;

$B_r$=resonance field;

$m_e$=electron mass.

For example, regardless of the gas used, injection of the microwave power takes place at a frequency of 2.45 GHz, for a value of the magnetic field corresponding to the electronic cyclotron resonance of the order of 875 Gauss.

Preferably, the magnetic field applied in the deposition chamber 6 is of the strongly unbalanced magnetic mirror type. The magnetic field is maximum in the top part of the deposition chamber 6 at the injection of the microwave power. This same magnetic field is then minimum at the center of the deposition chamber 6 and then increases again when approaching the substrate 8.

Still as an example, the value of the magnetic field at the microwave injection is 2700 Gauss, while the value of this magnetic field at the center of the deposition chamber 6 is about 500 Gauss.

Note that with reference to FIG. 1, the equimodulus lines of the magnetic field 44, 45, 46, 47 are represented, the equimodulus lines 44, 45 representing the zone of the deposition chamber 6 in which the value of the magnetic field is 500 Gauss. Note that the value of the magnetic field at the electronic cyclotron resonance zone 16 is about 875 Gauss.

The device 1 also comprises a screen 22 delimiting a deposition zone 24 adjacent to at least one part of the substrate 8 comprising two electrically conducting elements 4. Preferably, the distance between the screen 22 and the substrate 8 is between about 0.1 and 10 mm.

Preferably, the screen 22 is a metallic plate positioned approximately perpendicular to the field lines 26 of the applied magnetic field.

In one preferred configuration, the shape of the metallic plate 22 is approximately rectangular, although obviously it may be in any other shape depending on the needs encountered.

Similarly, the substrate 8 is also placed approximately perpendicular to the field lines 26 of the magnetic field applied inside the deposition chamber 6.

According to a preferred embodiment of the invention, the substrate 8 is heated using a filament 40 and a heating connection 42. In particular, this heating supplies the activation energy necessary for growth of the nanotube 2. The temperature of the substrate 2 is then between about 500° C. and about 700° C.

The device 1 is capable of operating as follows.

Injection of microwave power into the deposition chamber in which there is a magnetic mirror type magnetic structure with high magnetic confinement, causes the dissociation and/or ionization of the gas containing carbon, also injected into the deposition chamber 6 through the gas injection means 13, 14.

For example, the following chemical reaction occurs during methane injection:

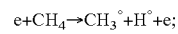

Also as an example, the following chemical reactions occur if the gas used is acetylene:

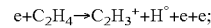

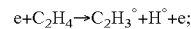

In each case, the result is CxHy° type non-condensable free radicals. These reactive radicals are the species that it is required to make penetrate inside the deposition zone 24 of device 1, in order to lead to the formation of high quality nanotubes. For example, it would be possible to obtain solid nanotubes or single wall nanotubes.

The species produced following ionization and/or dissociation of the gas containing carbon include particularly $C^+$, $C_2^+$ type electrons and ions that are directly condensable species that are capable of being deposited anywhere. CxHy+ type non-condensable ions will also be present. The elements mentioned above are not conducive to the growth of nanotubes and/or nanowires like those to be obtained between the electrically conducting elements 4, therefore the device 1 was designed to prevent these elements from accessing the deposition zone 24, in which the electrically conducting elements 4 to be connected are located.

The ionized condensable species and the ionized non condensable species mentioned above are magnetized, and therefore diffuse from top to bottom in the deposition chamber 6, towards the substrate 8, along the lines of field 26 of the applied magnetic field. Note, as shown in FIG. 2, that the electrons wind around the lines of field 26 according to the Laplace force and are diffused along these lines 26.

Consequently, with this arrangement, the $C^+$, $C_2^+$, $CxHy^+$ type ionized species produced are indifferently deposited on the screen plate 22, or on part of the insulating layer 9 that is not protected by this plate 22 (FIG. 2). The combined effect of their location on the field lines 26 and the position of the screen plate 22 with respect to the direction of the field lines 26, prohibits these ionized species from accessing the deposition zone 24.

On the other hand, the non-magnetized $CxHy°$ type free radicals circulate freely inside the deposition chamber 6 without being subjected to an imposed propagation direction. Thus, when they arrive in the proximity of the screen plate 22, the absence of any imposed direction enables them to penetrate inside the deposition zone 24, in which the electrically conducting elements 4 are located.

Consequently, all that are present in the deposition zone 24 adjacent to part of the substrate 8 containing the two electrically conducting elements 4 are the free non condensable radicals mentioned above. This specific characteristic makes the quality of the nanotube 2 between the two electrically conducting elements 4 very good, rather than having several nanotubes in a "spider web" type configuration which can arise if species able to be deposited non selectively are present.

Note that non-selective carbon deposits caused by $C^+$, $C_2^+$ type condensable species on the screen plate 22 and on part of the substrate 8 not protected by this same plate 22, are shown as reference 29 in FIG. 2.

When they penetrate into this deposition zone 24, non-condensable free radicals are fixed firstly on one of the two electrically conducting elements 4 to be connected by setting up a carbon-metal bond. Once the fixation has been made, a catalytic dehydrogenation of these $CxHy°$ type compounds is set up.

The carbon atoms in solution diffuse in and/or on the electrically conducting element 4 to precipitate and create a carbon nanotube 2, that then gradually moves in the direction of the other electrically conducting element 4, while remaining in contact with the substrate 8.

Note that the direction of growth of the nanotubes 2 may be better controlled by adding a temperature gradient, a magnetic field and an electric field in the deposition zone 24. Several of the above mentioned elements could also be accumulated.

With this type of device 1, it is possible to obtain carbon nanotubes 2 or nanowires with a diameter measuring from 1 to 100 nanometers, the contact of these nanotubes 2 with the electrically conducting elements 4 being very satisfactory particularly due to the continuity between the ends of these nanotubes and the electrically conducting elements 4.

The invention also relates to a process for making at least one nanotube 2 connecting two electrically conducting elements 4 that may be implemented by a device 1 like that described above. As already mentioned, the electrically conducting elements 4 are located on a substrate 8. The process according to the invention uses a microwave power in a deposition chamber 6, this chamber also being subjected to a magnetic field. Inside the deposition chamber 6, there is an electronic cyclotron resonance zone 16, such that a gas containing carbon is introduced at low pressure inside this deposition chamber 6 causing the ionization and/or dissociation of this gas in the electronic cyclotron resonance zone 16. The process also comprises a screening operation of the various species produced in the electronic cyclotron resonance zone 16. During this screening operation, only $CxHy°$ type non condensable free radicals are allowed to penetrate into a deposition zone 24 adjacent to at least one part of the substrate 8 comprising the electrically conducting elements 4, to make the nanotube 2.

Obviously, a person skilled in the art could make various modifications to the process and device that have just been described solely as non-limitative examples.

The invention claimed is:

1. Process for making at least one nanotube between two electrically conducting elements located on a substrate, the said process using, inside a deposition chamber, a microwave power, a magnetic field, and at least one electronic cyclotron resonance zone faciliting ionization and/or dissociation of a gas containing carbon injected into the deposition chamber,
    characterized in that the gas containing carbon is injected at a low pressure less than about $3 \times 10^{-3}$ mbars inside the deposition chamber, causing ionization and/or dissociation of this gas in each electronic cyclotron resonance zone, the ions and electrons produced being located along the field lines of the magnetic field set up in the deposition chamber,
    the process also comprising a screening operation of the various species produced in each electronic cyclotron resonance zone to enable exclusive access of $CxHy°$ non condensable free radicals produced to access a deposition zone adjacent to at least one part of the substrate comprising the said two electrically conducting elements to make the said nanotube.

2. Process according to claim 1, characterized in that the screening operation is made by inserting a metallic plate between the electronic cyclotron resonance zone and the electrically conducting elements, the said metallic plate being approximately perpendicular to the field lines of the magnetic field applied in the deposition chamber, such that the ions and electrons produced do not penetrate into the deposition zone.

3. Process according to claim 1, characterized in that a direction of growth of each nanotube is made preferential by the application of at least one of the elements selected from the group consisting of a temperature gradient, a magnetic field and an electric field, in the said deposition zone.

4. Process according to claim 1, characterized in that it comprises the following steps:
    heat the substrate,
    apply the microwave power inside the deposition chamber,
    inject the gas containing carbon,
    apply the magnetic field inside the deposition chamber, so as to create field lines approximately perpendicular to the said substrate and cause ionization and/or dissociation of the gas in each electronic cyclotron resonance zone, such that the ions and the electrons produced are located on the field lines of the magnetic field, and
    screen the species produced to enable exclusively $CxHy°$ non-condensable free radicals to access the deposition zone.

5. Process according to claim 4, characterized in that the heating operation of the substrate takes place at a temperature of between about 500 C. and about 700 C.

6. Process according to claim 1, characterized in that the frequency of the microwave power used in the deposition chamber is about 2.45 GHz.

7. Process according to claim 1, characterized in that the gas containing carbon is chosen among alkanes, alkenes, alkynes and mixes of these gasses.

8. Process according to claim 1, characterized in that the low injection pressure of the gas containing carbon is about $8 \times 10^{-4}$ mbars.

9. Process according to claim 1, characterized in that the magnetic field applied in the deposition chamber is of the highly unbalanced magnetic mirror type, the magnetic field being maximum at the injection of the microwave power, minimum at the center of the deposition chamber, and increasing again when approaching the substrate.

10. Process according to claim 1, characterized in that the electrically conducting elements comprise at least one zone containing at least one element chosen from among iron, nickel, cobalt or any other metal or alloy with catalytic fixation and dehydrogenation properties of $CxHy°$ non condensable free radicals.

* * * * *